United States Patent [19]

Hwang et al.

[11] Patent Number: 5,007,025
[45] Date of Patent: Apr. 9, 1991

[54] POWER AND SIGNAL LINE BUSSING METHOD FOR MEMORY DEVICES

[75] Inventors: Sang K. Hwang, Sang Ju; Tae S. Jung, Buchon; Kyu H. Choi, Seoul, all of Rep. of Korea

[73] Assignee: Samsung Electronics Co., Ltd., Suwon, Rep. of Korea

[21] Appl. No.: 330,917

[22] Filed: Mar. 31, 1989

[30] Foreign Application Priority Data

Jul. 21, 1988 [KR] Rep. of Korea .................. 88-9162

[51] Int. Cl.$^5$ ............................................. G11C 13/00
[52] U.S. Cl. ...................................... 365/226; 365/51
[58] Field of Search ............. 365/51, 52, 63, 226–229

[56] References Cited

U.S. PATENT DOCUMENTS

| 4,426,689 | 1/1984 | Henle et al. | 365/52 |
| 4,439,841 | 3/1984 | Itoh et al. | 365/51 |
| 4,791,609 | 12/1988 | Ito | 365/63 |
| 4,811,288 | 3/1989 | Kleijn et al. | 365/228 |

Primary Examiner—Terrell W. Fears
Attorney, Agent, or Firm—Cushman, Darby & Cushman

[57] ABSTRACT

A memory cell device having circuitry located between memory cell arrays comprises power and ground lines to the circuitry formed directly above the memory cell arrays. The power and ground lines are parallel and positioned in an adjacent alternating pattern such that a power line is positioned adjacent a ground line, which is positioned adjacent another power line and so on. Signal lines carrying signals to and from the circuitry are also formed directly above memory cell arrays.

3 Claims, 1 Drawing Sheet

POWER AND SIGNAL LINE BUSSING METHOD FOR MEMORY DEVICES

BACKGROUND OF THE INVENTION

1. Field of the Invention

The present invention relates to a power and signal line bussing method for high density and high speed memory devices.

2. Description of the Prior Art

A conventional power line bussing method is shown in FIG. 1. Chip 1 has two memory cell arrays 2 centered around peripheral circuitry 4, which comprises multiple logic circuits. Power line 3a supplies power from Vcc pad 5 to peripheral circuitry 4. Power line 3a runs from Vcc pad 5, around memory cell array 2, to peripheral circuitry 4. Ground line 3b electrically connects peripheral circuitry 4 with GND pad 5'. Ground line 3b runs from GND pad 5', around memory cell array 2, to peripheral circuitry 4.

However, employing a single power line 3a to couple power to peripheral circuitry 4 does not effectively reduce noise. To best reduce noise, a power line should be coupled independently to each circuit in peripheral circuitry 4. Yet, separating power line 3a further would increase the chip size because the area around memory cell arrays 2 would need to be enlarged. Thus, the bussing arrangement according to the conventional bussing method is not conductive to noise reduction nor high density packing.

A conventional signal line bussing arrangement for chip 1 is shown in FIG. 2. Pad signal line 3', positioned around memory cell arrays 2, supplies signals from external pad 6 to peripheral circuit 4. Circuit signal line 3'', also positioned around memory cell array 2, supplies signals from internal circuit 6' to peripheral circuitry 4.

However, signal line bussing according to this arrangement results in large signal delays because signals from pad 6 or internal circuit 6' must propagate the extra distance required to circumvent memory cell arrays 2.

A final disadvantage of conventional bussing arrangement arises inherently from the design. During conventional packaging processes, a passivation layer and an insulation layer are formed above the memory cell array. A final package material layer is then formed on top of the passivation layer. Yet, even with the passivation and insulation layers, radiation generated from the package material layer penetrates the memory cells and causes a soft (or operation) error. To prevent this soft error, an additional shield layer formed on the memory cell array is desired.

SUMMARY OF THE INVENTION

An object of the present invention is to provide an efficient power and signal bussing arrangement for high speed and high density memory arrays.

Another object of the present invention is to reduce chip noise generated in high speed memory devices without increasing chip size.

Still another object of the present invention is to provide a fast access time by eliminating excess path distance.

Yet another object is to provide an additional insulative layer above memory cells to reduce soft error.

To achieve these objects, power, ground and signal lines are formed directly above the memory cell array. The power and ground lines are parallel and positioned in an adjacent alternating pattern.

BRIEF DESCRIPTION OF THE DRAWINGS

The present invention will become more fully understood from the detailed description given hereinbelow and the accompanying drawings which are given by way of illustration only and are not to limit the present invention, wherein.

DETAILED DESCRIPTION

Figure 1:
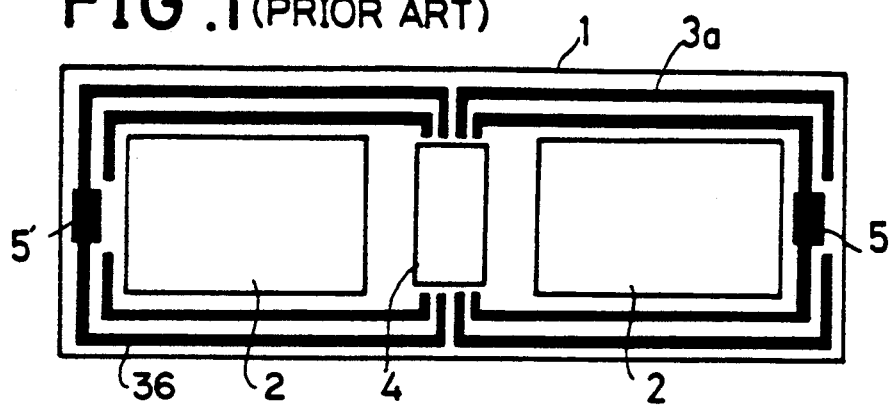
FIG. 1 is a top view of a power line bussing method according to the prior art.
Figure 2:
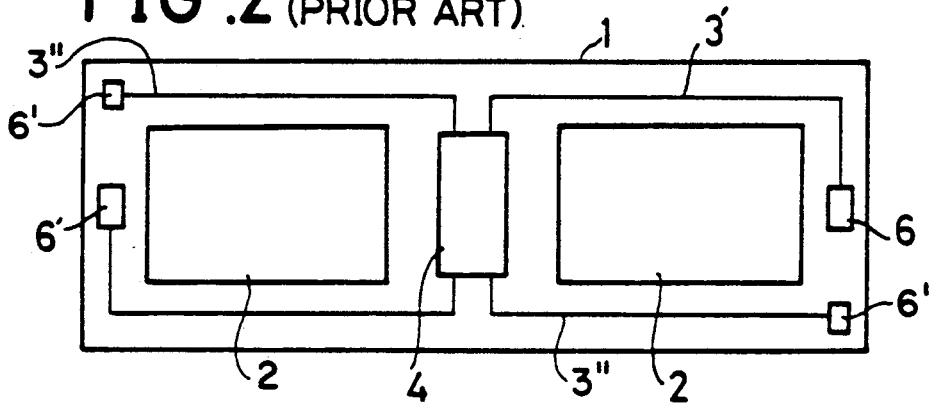
FIG. 2 is a top view of a signal line bussing method according to the prior art.
Figure 3:
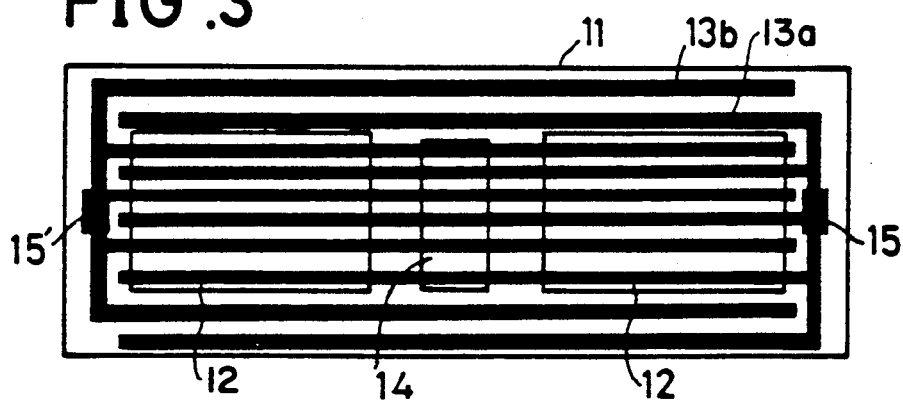
FIG. 3 is a top view of a power line bussing method according to the present invention.
Figure 4:
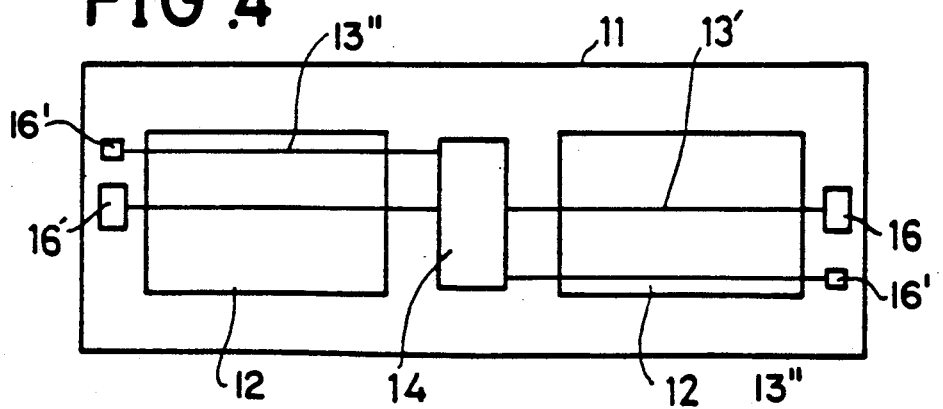
FIG. 4 is a top view of a signal line bussing method according to the present invention.

FIG. 3 shows a power line bussing arrangement according to the present invention. Chip 11 comprises two memory cell arrays 12 centered around peripheral circuitry 14. Power lines 13a, formed above memory cell arrays 12 and peripheral circuitry 14, supplies power from Vcc pad 15 to peripheral circuitry 14. Ground lines 13b, formed above memory cell arrays 12 and peripheral circuitry 14, connects peripheral circuitry 14 to GND pad 15'. Both power lines 13a and ground lines 13b are separated parallel lines traversing end-to-end chip 11. All power lines 13a are connected to Vcc pad 15 and all ground lines 13b are connected to GND pad 15'. Ground lines 13b and power lines 13a are formed in an adjacent alternating pattern such that a power line 13a is positioned adjacent to ground line 13b, which is positioned adjacent another power line 13a, and so on.

Accordingly, Vcc power is supplied through Vcc pad 15 and power lines 13 to each circuit in the peripheral circuitry 14. By coupling a power line independently to each circuit in peripheral circuitry 14, noise generated by these circuits is minimized.

Chip 11 further comprises external pad 16 and internal circuit 16'. Pad signal line 13', formed above memory cells 12, couples external pad 16 to peripheral circuitry 14. Circuit signal line 13'', formed above memory cells 12, couples internal circuit 16' to peripheral circuitry 14.

The present invention is advantageous to high speed memory devices. According to this bussing arrangement, signals carried by pad signal line 13' and circuit signal line 13'' propagate directly to, and directly from, peripheral circuitry 14. Thus, propagation time is decreased, thereby improving chip speed.

The present invention is also advantageous for high density memory devices. Bussing the power, ground and signal lines directly across memory cell arrays, rather than around these arrays, reduces chip size by eliminating the area around the memory cell arrays.

Further, forming power lines 13a, ground lines 13b, and signal lines 13', 13'' above memory cell arrays 12 provides an additional shield layer between memory cell arrays 12 and the package material layer. Thus, soft error is reduced.

What is claimed is:

1. A memory device formed on a semiconductor substrate having circuitry positioned adjacent a single memory cell array, said memory device comprising:
   a plurality of power lines formed above said single memory cell array for supplying power to said circuitry, each power line being substantially parallel to and spaced apart from every other power line; and a plurality of ground lines formed above said single memory cell array for supplying ground potential to said circuitry, each ground line being substantially parallel to and spaced apart from every other ground line.

2. A memory device according to claim 1, further comprising at least one signal line formed directly above said single memory cell array to carry signals to said circuitry.

3. A method for forming power and signal lines on a memory device, said memory device being formed on a semiconductor substrate and having a single memory cell array, comprising the steps of:

forming a plurality of substantially parallel power lines above said single memory cell array;

forming a plurality of substantially parallel ground lines above said single memory cell array; and forming a plurality of signal lines above said single memory cell array.

* * * * *